(12) United States Patent
Nguyen et al.

(10) Patent No.: US 6,980,006 B1
(45) Date of Patent: Dec. 27, 2005

(54) HIGH SPEED ENVELOPE DETECTOR AND METHOD

(75) Inventors: Trung Nguyen, San Jose, CA (US);
Hung Truong, San Jose, CA (US);
Oanh Kim, Hayward, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 691 days.

(21) Appl. No.: 09/767,364

(22) Filed: Jan. 22, 2001

(51) Int. Cl.[7] ............................................. G01R 31/08

(52) U.S. Cl. ................................................... 324/522

(58) Field of Search .............................. 714/721, 724, 714/795; 326/86; 324/765, 763, 647, 656, 324/665, 672, 679, 705, 522

(56) References Cited

U.S. PATENT DOCUMENTS

| | | | | |
|---|---|---|---|---|
| 4,809,554 A | * | 3/1989 | Shade et al. | 73/587 |
| 4,890,066 A | * | 12/1989 | Straver et al. | 329/369 |
| 6,556,535 B1 | * | 4/2003 | Kobayashi | 369/116 |

* cited by examiner

Primary Examiner—Albert Decady
Assistant Examiner—James C. Kerveros
(74) Attorney, Agent, or Firm—Stattler Johansen & Adeli LLP

(57) ABSTRACT

Envelope detector and method for determining whether the level of a differential input signal DPIN–DNIN is above a reference voltage $V_{REF}$. The differential input signal is converted to a differential current IDP–IDN, the reference voltage is converted to a reference current $I_{REF}$, the currents are compared to determine if |IDP–IDN| is greater than $I_{REF}$, and a valid differential signal is indicated when |IDP–IDN| is greater than $I_{REF}$.

11 Claims, 5 Drawing Sheets

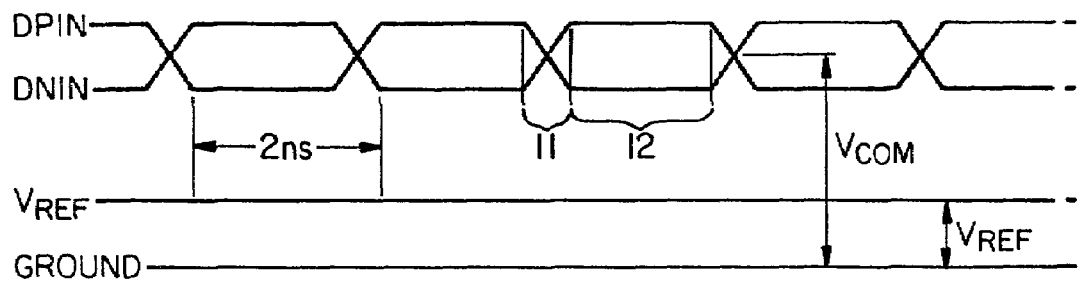
FIG_1
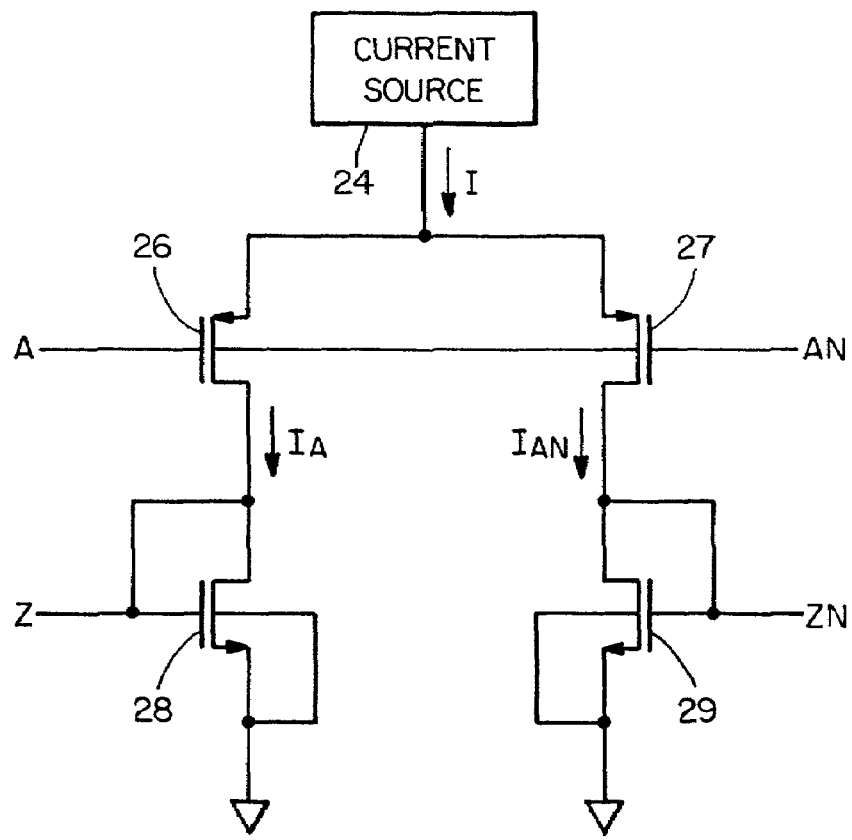
FIG_3

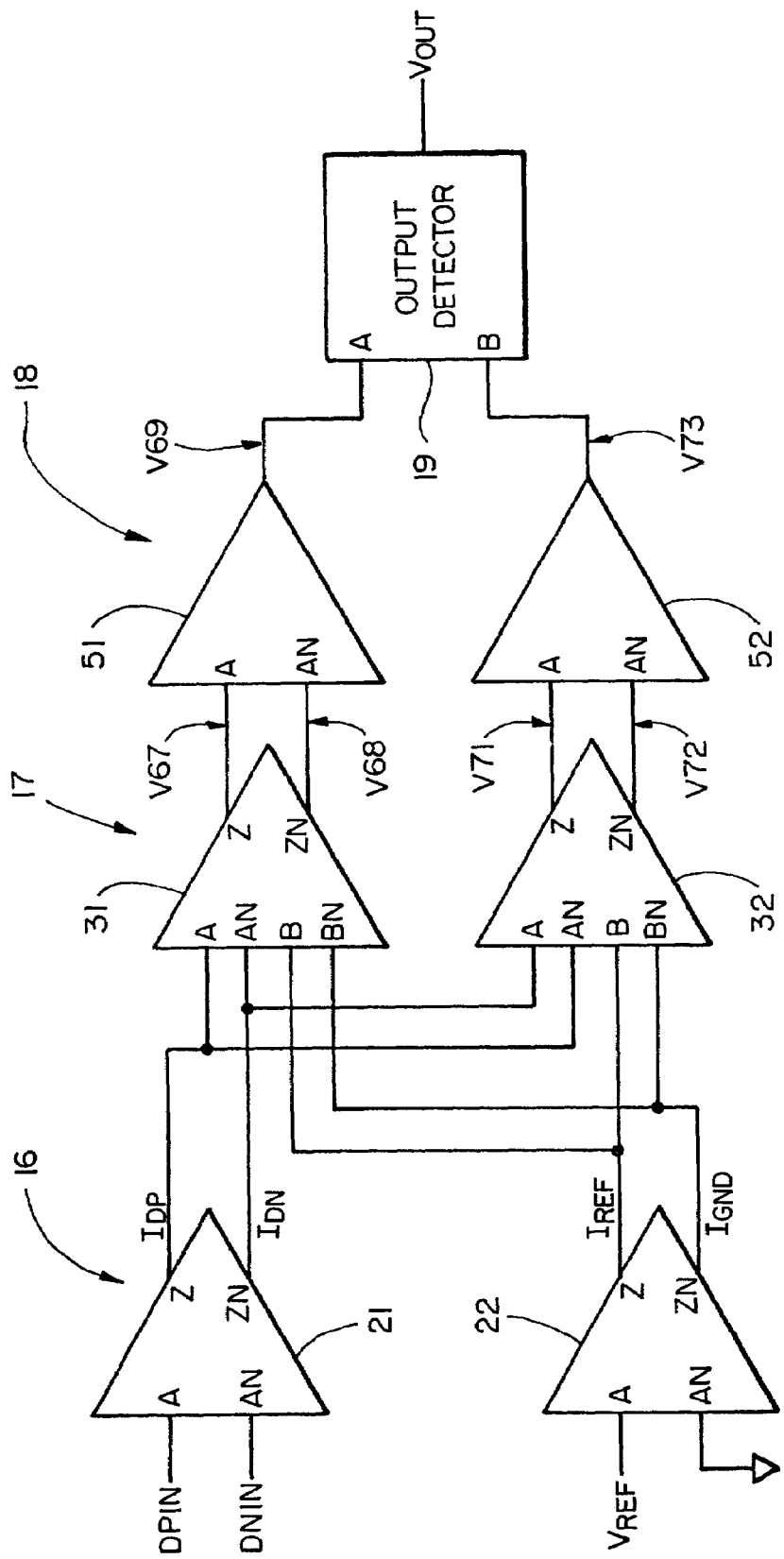
FIG_2

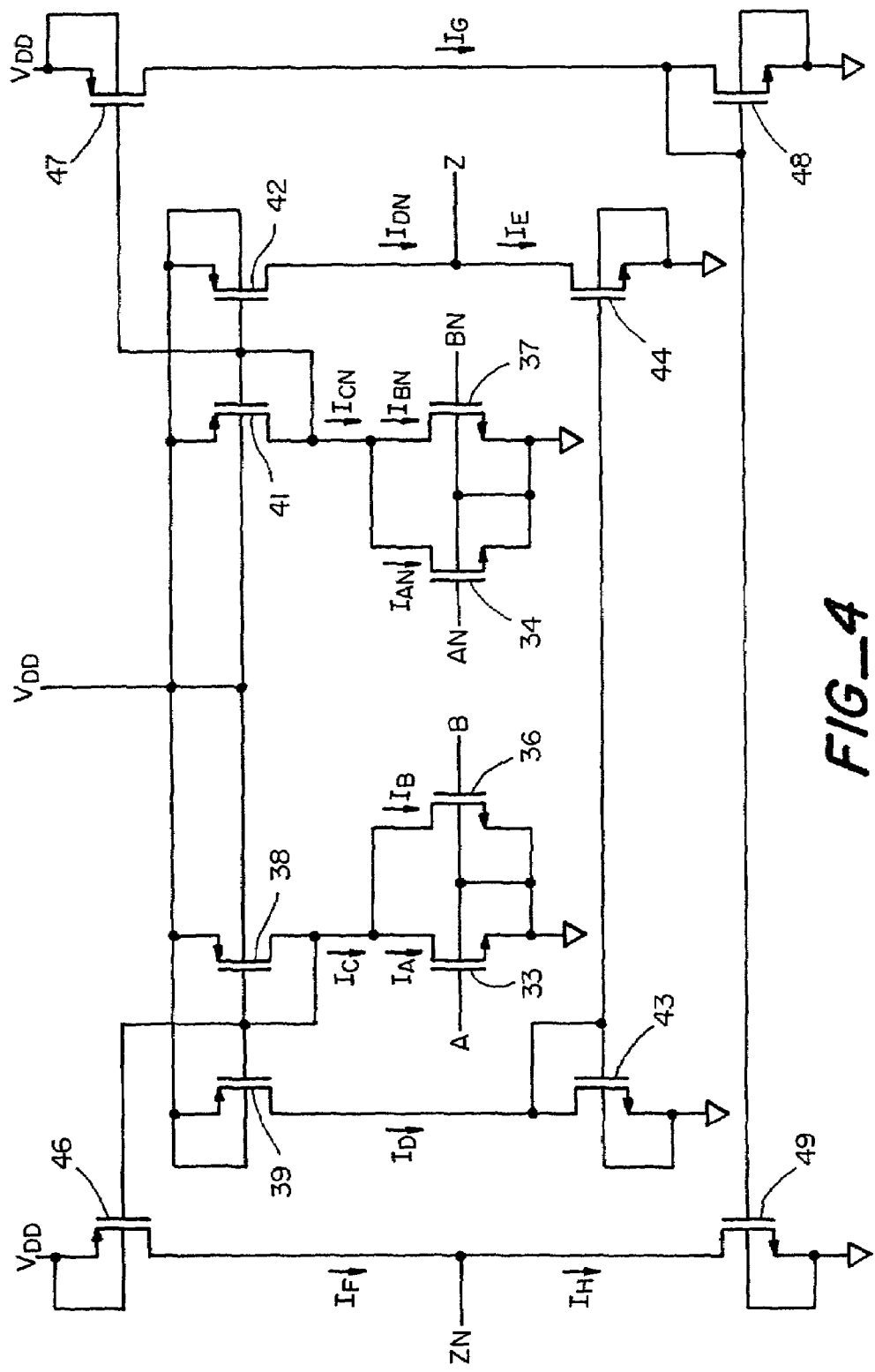
FIG_4

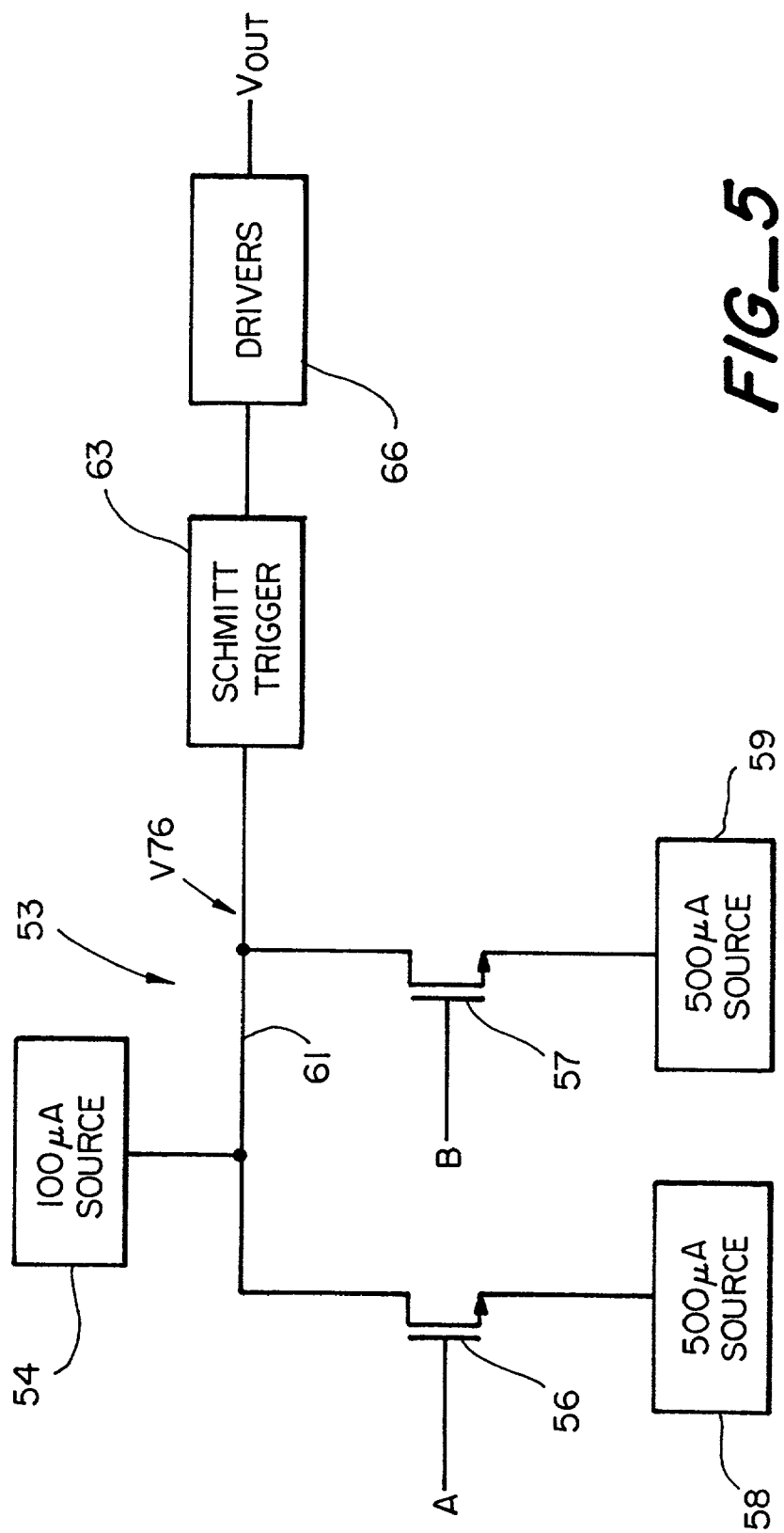

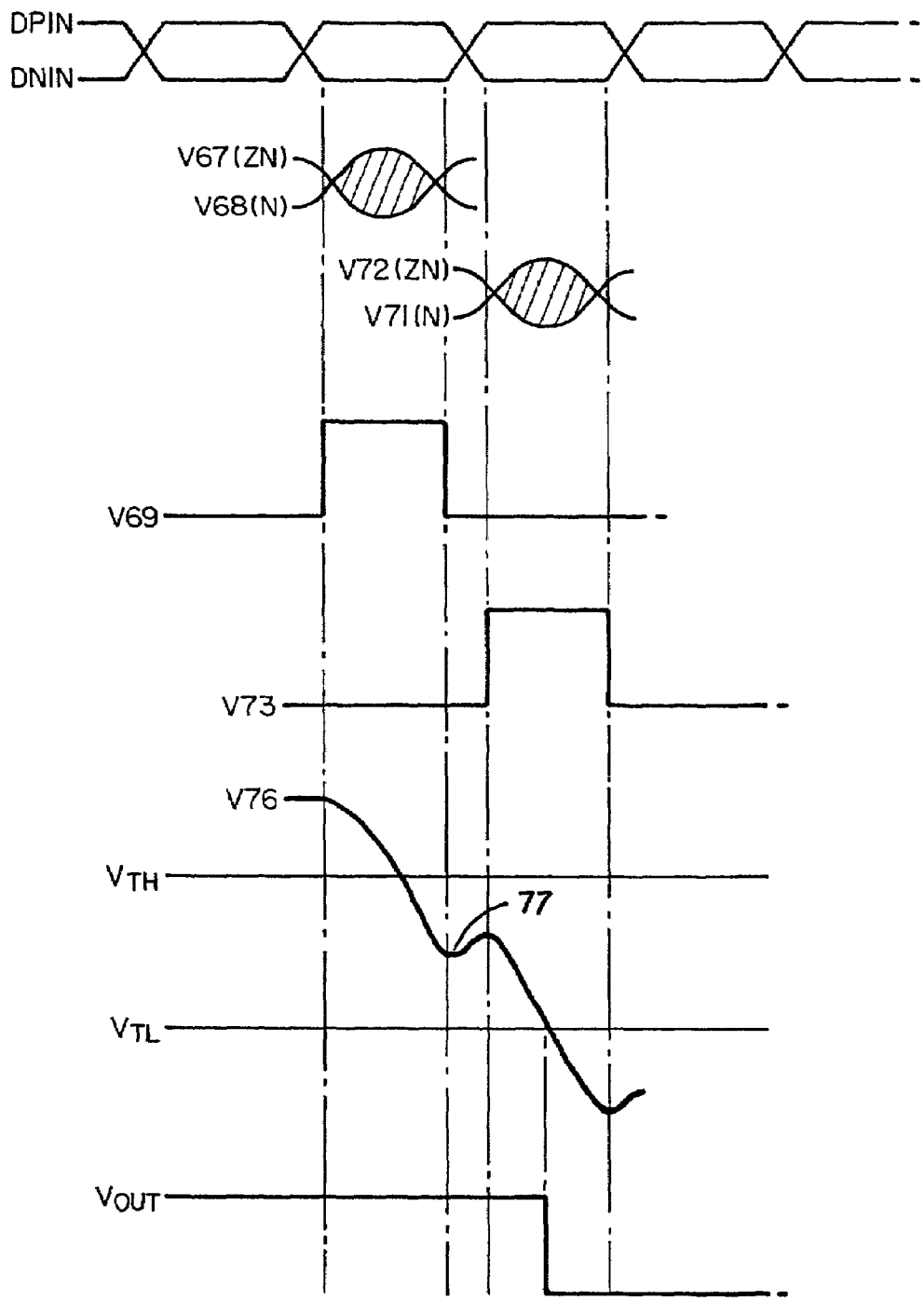
FIG_6

HIGH SPEED ENVELOPE DETECTOR AND METHOD

FIELD OF THE INVENTION

This invention pertains generally to electrical signal processing circuits and, more particularly, to an envelope detector and method for determining when a differential signal is greater than a predetermined level.

BACKGROUND OF THE INVENTION

As illustrated in FIG. 1, the differential signal DPIN−DNIN is a cyclical switching signal in which DPIN and DNIN alternate in level during successive cycles and cross over during a switching interval 11 between the cycles. During each cycle, there is a stable period 12 in which both DPIN and DNIN remain constant in level. The differential signal is considered to be valid when it is greater in level than a reference signal $V_{REF}$, i.e. when |DPIN−DNIN|>$V_{REF}$, and invalid when it is below the level of the reference signal, i.e. when |DPIN−DNIN|<$V_{REF}$.

In a typical application, the differential signal might, for example, have a level of about 150–180 mV, and the reference voltage might have a level on the order of 125 mV. The differential signal is a high speed signal, with a typical rate of on the order of 0.5 gigabit per second and a relatively wide common mode voltage $V_{COM}$ ranging from about −50 mV to about +500 mV. The reference voltage and the common mode voltage are both referenced to ground. For the envelope detector to begin indicating the validity of the differential signal within a few cycles of start-up, it must complete its evaluation and indicate the validity of the signal within about 8 nanoseconds, or less. In this particular example, the differential signal is considered to be valid if DPIN−DNIN>$V_{REF}$ or DNIN−DPIN>$V_{REF}$ for about 0.5 nanosecond or more during the stable period.

Differential signals of this type are commonly found in and around personal computers, e.g. on USB keyboard cables.

Envelope detectors heretofore provided have had certain limitations and disadvantages such as only working with single-ended signals, relatively high signal levels (e.g., 0.7 volt), and relatively slow signals (e.g., 10 Mhz or less).

SUMMARY OF THE INVENTION

It is in general an object of the invention to provide a new and improved envelope detector and method.

Another object of the invention is to provide an envelope detector and method of the above character which are suitable for use with differential signals.

Another object of the invention is to provide an envelope detector and method of the above character which operate at a higher speed than envelope detectors of the prior art.

These and other objects are achieved in accordance with the invention by providing an envelope detector and method for determining whether the level of a differential input signal DPIN−DNIN is above a reference voltage $V_{REF}$. The differential input signal is converted to a differential current IDP−IDN, the reference voltage is converted to a reference current $I_{REF}$, the currents are compared to determine if |IDP−IDN| is greater than $I_{REF}$, and a valid differential signal is indicated when |IDP−IDN| is greater than $I_{REF}$.

BRIEF DESCRIPTION OF THE DRAWINGS

FIG. 1 is a waveform diagram illustrating a differential signal of the type which is monitored for validity by the invention.

FIG. 2 is a block diagram of one embodiment of an envelope detector incorporating the invention.

FIG. 3 is a simplified circuit diagram of one embodiment of a voltage-to-current converter for use in the embodiment of FIG. 2.

FIG. 4 is a simplified circuit diagram of one embodiment of a current comparator for use in the embodiment of FIG. 2.

FIG. 5 is a block diagram of one embodiment of an output detector for use in the embodiment of FIG. 2.

FIG. 6 is a waveform diagram, illustrating the operation of the envelope detector.

DETAILED DESCRIPTION OF THE INVENTION

As illustrated in FIG. 2, the envelope detector includes a voltage-to-current converter stage 16 which converts the differential input voltage DPIN−DNIN to a differential current IDP−IDN and the reference voltage $V_{REF}$ to a reference current $I_{REF}$, a comparator stage 17 which determines whether the differential current level is greater than the reference current, a voltage amplifier 18 for increasing the level of the signals from the comparator stage, and an output detector 19 which provides an output signal indicative of a valid differential input signal when the level of the differential current is greater than the reference current. The output detector also maintains the output signal during the switching interval following a cycle in which the level of the differential current is greater than the reference current.

In the converter stage, differential input signals DPIN and DNIN are applied to the A and AN inputs of a first voltage-to-current converter 21, and the differential currents IDP and IDN are produced at the Z and ZN outputs of the converter. The reference voltage is applied differentially to a second voltage-to-current converter 22 by applying the reference voltage $V_{REF}$ to the A input of the converter and connecting the AN input to ground. The reference current $I_{REF}$−$I_{GND}$ appears at the Z and ZN outputs of converter 22. In the embodiment disclosed, $V_{GND}$ and $I_{GND}$ are assumed to be zero, and the reference voltage and reference current are referred to simply as $V_{REF}$ and $I_{REF}$, respectively. However, it will be understood that $I_{REF}$ is actually a differential current which may contain a non-zero ground component.

As illustrated in FIG. 3, each of the voltage-to-current converters comprises a current source 24, a differential pair consisting of complementary transistors 26, 27, and current mirroring transistors 28, 29. The current source provides a current I which is divided between transistors 26, 27. The differential voltage is applied to input terminals A, AN which are connected to the bases of transistors 26, 27 to control the differential currents $I_A$, $I_{AN}$ that are delivered to the current mirroring transistors.

In converter 21, the differential voltages which are applied to terminals A and AN are DPIN and DNIN, and the currents $I_A$ and $I_{AN}$ are IDP and IDN, respectively. The greater the difference in voltage in DPIN and DNIN, the greater the difference in current in IDP and IDN.

In converter 22, the reference voltage $V_{REF}$ is applied to input terminal A, input terminal AN is connected to ground, and current $I_A$ is replaced by $I_B$ which is the reference current $I_{REF}$. Current IAN is replaced by $I_{BN}$.

Comparator stage 17 includes a first current comparator 31 which compares IDP–IDN with reference current $I_{REF}$, and a second current comparator 32 which compares IDN–IDP with $I_{REF}$. Thus, IDP is applied to the A input of comparator 31, IDN is applied to the AN input, $I_{REF}$ is applied to the B input, and $I_{GND}$ is applied to the BN input. In comparator 32, the connections are reversed, with IDN being applied to the A input and IDP being applied to the AN input. $I_{REF}$ is still applied to the B input, and $I_{GND}$ is applied to the BN input.

As illustrated in FIG. 4, in each of the comparators, the input terminals A, AN are connected to the bases of transistors 33, 34. These transistors form current mirrors with transistors 28, 29 in voltage-to-current converter 21, whereby differential currents $I_A$, $I_{AN}$ (i.e., IDP and IDN) are mirrored from the converter to the comparator. Input terminals B, BN are connected to the bases of transistors 36, 37. These transistors form current mirrors with transistors 28, 29 in voltage-to-current converter 22, whereby the differential currents $I_B$, $I_{BN}$ (i.e., $I_{REF}$) are mirrored from the converter to the comparator.

The drains of transistors 33, 36 are connected together and supplied with a current $I_C$ which is divided between $I_A$ and $I_B$ so that $I_C = I_A + I_B$. Similarly, the drains of transistors 34, 37 are connected together and supplied with a current $I_{CN}$ which is divided between $I_{AN}$ and $I_{BN}$ so that $I_{CN} = I_{AN} + I_{BN}$. A current mirror consisting of transistors 38, 39 translates $I_C$ to $I_D$, and a multiplying current mirror consisting of transistors 41, 42 translates $2I_{CN}$ to $I_{DN}$. A multiplying current mirror consisting of transistors 43, 44 translates $2I_D$ to $I_E$. $I_{DN}$ divides between $I_E$ and output terminal Z. Thus, when $I_{DN} > I_E$, current flows out of the output terminal, and when $I_{DN} < I_E$, current flows into the output terminal.

A multiplying current mirror consisting of transistors 38, 46 translates $2I_C$ to $I_F$, and a current mirror consisting of transistors 41, 47 translates $I_{CN}$ to $I_G$. A multiplying current mirror consisting of transistors 48, 49 translates $2I_I$ G to $I_H$. $I_F$ divides between $I_H$ and output terminal ZN. Thus, when $I_F > I_H$, current flows out of the output terminal, and when $I_F < I_H$, current flows into the output terminal.

Thus, the voltage at output terminal Z is high if $I_{DN} > I_E$ or if $I_{AN} + I_{BN} > I_A + I_B$, and is low if $I_{DN} < I_E$ or if $I_{AN} + I_{BN} < I_A + I_B$. Similarly, the voltage at output terminal ZN is high if $I_F > I_H$ or if $I_{AN} + I_{BN} < I_A + I_B$, and is low if $I_F < I_H$ or if $I_{AN} + I_{BN} > I_A + I_B$. In other words, the differential voltages at A and AN are results of $(I_A + I_B) - (I_{AN} + I_{BN})$.

Comparator 32 is similar to comparator 31 except that the connections to input terminals A and AN are reversed, with the Z output of voltage-to-current converter being applied to terminal AN and the ZN output being applied to terminal A. Thus, in this comparator, transistors 28, 34 and 29, 33 form the current mirrors which mirrors the currents $I_A$ and $I_{AN}$ into the comparator.

Amplifier stage 18 comprises a pair of conventional amplifiers 51, 52 which amplify the output signal voltages from the comparators to the full rail voltage. Thus, the Z and ZN outputs of comparator 31 are connected to the A and AN inputs of amplifier 51, and the Z and ZN outputs of comparator 32 are connected to the A and AN inputs of amplifier 52. The outputs of the two amplifiers are connected to the inputs of output detector 19.

As illustrated in FIG. 5, output detector 19 includes an OR gate 53 comprising a 100 μA current source 54, a pair of transistor switches 56, 57, and a pair of 500 μA current sources 58, 59. The output of the 100 μA current source is connected to the drains of the two transistors, and the 500 μA current sources are connected between the sources of the transistors and ground. The output voltages from amplifiers 51, 52 are applied to the gates of the transistors via input terminals A, B.

When the A and B inputs are both low, transistors 56, 57 are both turned off, and node 61 is pulled high by the 100 μA current source. If one of the inputs is high, the transistor to which it is connected is turned on, and the 500 μA current source connected to that transistor overcomes the 100 μA source, pulling node 61 low.

The signal at node 61 is applied to the input of a Schmitt trigger 63 which filters out the small glitch which occurs during the switching interval when the differential signal drops below the reference level.

The output of the Schmitt trigger is connected to a driver stage 66 which provides an output signal which is low for valid differential input signals ($|DPIN-DNIN| > V_{REF}$) and high for invalid signals ($|DPIN-DNIN| < V_{REF}$).

Operation and use of the envelope detector, and therein the method of the invention can be described with reference to the waveforms shown in FIG. 6. The differential signal DPIN–DNIN and the reference voltage $V_{REF}$ are converted to a differential current IDP–IDN and a reference current $I_{REF}$ by voltage-to-current converters 21, 22. The level of the differential current is compared with that of the reference current in comparators 31, 32, with comparator 31 subtracting $I_{REF}$ from IDP–IDN, and comparator 32 subtracting $I_{REF}$ from IDN–IDP.

During cycles in which DPIN>DNIN and the input signal is valid, the voltage V67 from the Z output of comparator 31 crosses above the voltage V68 from the ZN output of that comparator. When V67 is greater than V68, the voltage V69 at the output of amplifier 51 is high. During cycles in which DNIN>DPIN and the input signal is valid, the voltage V71 from the Z output of comparator 32 crosses above the voltage V72 from the ZN output of that comparator. When V71 is greater than V72, the voltage V73 at the output of amplifier 52 is high. During cycles in which the differential input signal is invalid, comparator outputs V67, V71 will not cross above outputs V68, V72, and the outputs of amplifiers 51, 52 will remain low.

When the output of either or both of amplifiers 51, 52 is high, node 61 is pulled low, and the voltage V76 at that node decreases. After a few cycles of valid signal, voltage V76 will drop to the lower trigger level $V_{TL}$ of Schmitt trigger 63, which then switches to its low (logic 0) output state, thus providing an output signal $V_{OUT}$ at the output of driver stage 66 indicative of a valid differential input signal. The Schmitt trigger remains in its low output state until the node voltage V76 rises above the upper trigger level $V_{TH}$.

The difference between the upper and lower threshold voltages of the Schmitt trigger is greater than the glitches 77 in the node voltage which occur during the switching intervals between the cycles of the differential signal. Thus, those glitches will not cause the output state of the Schmitt trigger to change, and they are thereby effectively filtered out.

When a valid differential input signal is not present, node voltage V76 is no longer pulled down by the larger 500 μA current sources, and the 100 μA current source pulls it in a positive direction. When the node voltage reaches the upper trigger level $V_{TH}$, the Schmitt trigger switches to its high output state, and it remains in that state until the node voltage drops to the lower trigger level.

The invention has number of important features and advantages. It determines the validity of differential input signals of relatively low magnitude and relatively high data rates. Converting the input and reference voltages to currents keeps the d.c. level of operation the same regardless of the common mode voltage of the differential inputs, and it is much easier to do addition and subtraction with currents than with voltages. The effect of glitches arising during the switching interval between successive cycles of the input signal is effectively filtered out.

It is apparent from the foregoing that a new and improved envelope detector and method have been provided. While only certain presently preferred embodiments have been described in detail, as will be apparent to those familiar with the art, certain changes and modifications can be made without departing from the scope of the invention as defined by the following claims.

What is claimed is:

1. An envelope detector for determining whether the level of a differential input signal DPIN–DNIN is above a reference voltage $V_{REF}$, the envelope detector comprising:
    (a) means for converting the differential input signal to a differential current IDP–IDN and the reference voltage to a reference current $I_{REF}$;
    (b) means for comparing the currents to determine if |IDP–IDN| is greater than $I_{REF}$; and
    (c) means for indicating a valid differential signal when |IDP–IDN| is greater than $I_{REF}$.

2. The envelope detector of claim 1, wherein the means for determining if |IDP–IDN| is greater than $I_{REF}$ includes a first comparator for comparing IDP–IDN with $I_{REF}$ and a second comparator for comparing IDN–IDP with $I_{REF}$.

3. The envelope detector of claim 2, wherein the means for indicating a valid differential signal includes an OR circuit coupled to the comparators for providing an output signal when IDP–IDN>$I_{REF}$ or IDN–IDP>$I_{REF}$.

4. A method of determining whether the level of a differential input signal DPIN–DNIN is above a reference voltage $V_{REF}$, the method comprising:
    (a) converting the differential input signal to a differential current IDP–IDN;
    (b) converting the reference voltage to a reference current $I_{REF}$;
    (c) comparing the currents to determine if |IDP–IDN| is greater than $I_{REF}$; and
    (d) indicating a valid differential signal when |IDP–IDN| is greater than $I_{REF}$.

5. The method of claim 4, wherein the currents are compared by comparing IDP–IDN and IDN–IDP with $I_{REF}$, and the valid differential signal is indicated if either IDP–IDN or IDN–IDP is greater than $I_{REF}$.

6. An envelope detector for determining whether the level of a differential input signal DPIN–DNIN is above a reference voltage $V_{REF}$, the differential input signal being cyclical with DPIN and DNIN each being greater than the other during alternate cycles and crossing over during a switching interval between the cycles, the envelope detector comprising:
    (a) means for converting the differential input signal to a differential current IDP–IDN and the reference voltage to a reference current $I_{REF}$;
    (b) means for comparing the currents and providing an output signal indicative of a valid differential signal when |IDP–IDN| is greater than $I_{REF}$; and
    (c) means for maintaining the output signal during the switching interval following a cycle in which |IDP–IDN| is greater than $I_{REF}$.

7. The envelope detector of claim 6, wherein the means for comparing the currents includes a first comparator for comparing IDP–IDN with $I_{REF}$ and a second comparator for comparing IDN–IDP with $I_{REF}$, and the means for providing the output signal includes an OR circuit coupled to the comparators for providing the output signal when IDP–IDN>$I_{REF}$ or IDN–IDP>$I_{REF}$.

8. The envelope detector of claim 7, wherein the means for maintaining the output signal comprises a Schmitt trigger responsive to the output signal from the OR circuit.

9. A method for determining whether the level of a differential input signal DPIN–DNIN is above a reference voltage $V_{REF}$, the differential input signal being cyclical with DPIN and DNIN each being greater than the other during alternate cycles and crossing over during a switching interval between the cycles, the method comprising:
    (a) converting the differential input signal to a differential current IDP–IDN and the reference voltage to a reference current $I_{REF}$;
    (b) comparing the differential current and the reference current;
    (c) providing an output signal indicative of a valid differential signal when |IDP–IDN| is greater than $I_{REF}$; and
    (d) maintaining the output signal during the switching interval following a cycle in which |IDP–IDN| is greater than $I_{REF}$.

10. The method of claim 9, wherein IDP–IDN and IDN–IDP are compared with $I_{REF}$, and the output signal is provided when IDP–IDN>$I_{REF}$ or IDN–IDP>$I_{REF}$.

11. The method of claim 9, wherein the output signal is passed through a Schmitt trigger having trigger levels set further apart than a change in the output signal during the switching interval.

* * * * *